US008736306B2

(12) United States Patent
King

(10) Patent No.: US 8,736,306 B2
(45) Date of Patent: May 27, 2014

(54) APPARATUSES AND METHODS OF COMMUNICATING DIFFERENTIAL SERIAL SIGNALS INCLUDING CHARGE INJECTION

(75) Inventor: Gregory King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/198,490

(22) Filed: Aug. 4, 2011

(65) Prior Publication Data
US 2013/0033290 A1 Feb. 7, 2013

(51) Int. Cl.
H03K 19/0175 (2006.01)
H03K 19/00 (2006.01)

(52) U.S. Cl.
USPC .............. 326/82; 327/108; 327/165; 341/155

(58) Field of Classification Search
USPC .......................................................... 326/82
See application file for complete search history.

(56) References Cited

U.S. PATENT DOCUMENTS

| 5,703,532 | A | * | 12/1997 | Shin et al. ...................... 330/253 |
| 6,501,293 | B2 | * | 12/2002 | Braceras et al. ................ 326/30 |
| 6,549,471 | B1 | | 4/2003 | Zivanovic |
| 6,784,703 | B1 | * | 8/2004 | Chung et al. ................... 327/112 |
| 6,952,573 | B2 | * | 10/2005 | Schucker et al. ............. 455/333 |
| 7,126,394 | B2 | | 10/2006 | Hargan |
| 7,187,206 | B2 | | 3/2007 | Clements et al. |
| 7,212,460 | B1 | | 5/2007 | Jung et al |
| 7,233,201 | B2 | | 6/2007 | King et al. |
| 7,262,641 | B2 | | 8/2007 | King |
| 7,312,626 | B2 | * | 12/2007 | Forbes ............................ 326/26 |
| 7,365,570 | B2 | | 4/2008 | King |
| 7,388,405 | B2 | * | 6/2008 | Tokunaga et al. ................ 326/83 |
| 7,443,211 | B2 | * | 10/2008 | Liu .................................. 327/108 |
| 7,480,347 | B2 | | 1/2009 | Black et al. |
| 7,577,212 | B2 | | 8/2009 | Keeth et al. |
| 7,587,537 | B1 | * | 9/2009 | Burney ........................... 710/71 |
| 7,672,380 | B2 | * | 3/2010 | Ho et al. ........................ 375/257 |
| 7,733,118 | B2 | | 6/2010 | Hollis et al. |
| 7,750,666 | B2 | * | 7/2010 | Zhang et al. .................... 326/30 |

(Continued)

FOREIGN PATENT DOCUMENTS

WO WO-2013020072 A2 2/2013
WO WO-2013020072 A3 2/2013

OTHER PUBLICATIONS

Active Terminators for CMOS Drivers, IBM Technical Disclosure Bulletin, Sep. 1989, US, vol. 32, No. 4A, p. 393-395.*

(Continued)

Primary Examiner — Alexander H Taningco
Assistant Examiner — Nelson Correa
(74) Attorney, Agent, or Firm — Schwegman, Lundberg & Woessner, P.A.

(57) ABSTRACT

Apparatuses and methods are disclosed, including an apparatus that includes a differential driver with charge injection pre-emphasis. One such apparatus includes a pre-emphasis circuit and an output stage circuit. The pre-emphasis circuit is configured to receive differential serial signals, and buffer the differential serial signals to provide buffered differential serial signals. The output stage circuit is configured to receive the buffered differential serial signals and drive the buffered differential serial signals onto differential communication paths. The pre-emphasis circuit is configured to selectively inject charge onto the differential communication paths to assist with a signal transition on at least one of the differential communication paths. Additional embodiments are disclosed.

23 Claims, 19 Drawing Sheets

(56) References Cited

U.S. PATENT DOCUMENTS

| | | | |
|---|---|---|---|
| 7,825,691 B2 * | 11/2010 | Liu | 326/83 |
| 7,869,494 B2 | 1/2011 | Hollis | |
| 7,915,915 B1 | 3/2011 | Kuzmenka et al. | |
| 8,183,887 B2 * | 5/2012 | Stojanovic et al. | 326/87 |
| 2006/0188043 A1 | 8/2006 | Zerbe et al. | |
| 2007/0152749 A1 * | 7/2007 | Liu | 330/129 |
| 2008/0304557 A1 | 12/2008 | Hollis | |
| 2008/0309377 A1 | 12/2008 | Lee | |
| 2009/0154591 A1 | 6/2009 | Wong et al. | |
| 2010/0066450 A1 | 3/2010 | Palmer et al. | |
| 2010/0117706 A1 * | 5/2010 | Stojanovic et al. | 327/306 |
| 2010/0177578 A1 | 7/2010 | King | |

OTHER PUBLICATIONS

IBM Technical Disclosure Bulletin article NA8909393, Sep. 1, 1989.*

Internation Application Serial No. PCT/US2012/049570, Written Opinion mailed Feb. 27, 2013.*

"High-Speed Data Networking Technology", Honeywell, Aerospace Electronic Systems, (Jun. 2005), 4 pages.

"International Application Serial No. PCT/US2012/049570, International Search Report mailed Feb. 27, 2013", 4 pgs.

"International Application Serial No. PCT/US2012/049570, Written Opinion mailed Feb. 27, 2013", 7 pgs.

* cited by examiner

APPARATUSES AND METHODS OF COMMUNICATING DIFFERENTIAL SERIAL SIGNALS INCLUDING CHARGE INJECTION

BACKGROUND

Drivers are circuits used for signal communication, either between integrated circuits ("ICs") or within a single IC. By way of example and not limitation, drivers can be used to communicate signals, such as to transmit data signals to and from a memory, or to transmit control signals to and from a memory controller.

A "differential" output driver receives substantially concurrently two input signals and generates substantially concurrently two output signals. Information is typically conveyed by the potential difference between the two output signals. One output signal typically has a potential substantially equal to a first supply voltage (e.g., VCC) and the other output signal typically has a potential substantially equal to a second supply voltage (e.g., VSS, which may be, for example, a negative voltage or ground). Such pairs of signals are known as differential signals. Differential output drivers are relatively immune to noise and jitter, because any noise or jitter that affects the voltage of one output signal will often affect in substantially the same way the voltage of the other output signal.

A serialization function of a serializer/deserializer (SerDes) converts parallel signals (e.g., data signals) to a serial signal(s) (e.g., in preparation for transmitting the serial data), and the deserialization function of the SerDes converts a received serial signal(s) to parallel signals. A SerDes can take a wide bit-width parallel bus and output differential signals that switch at a much higher frequency rate than the parallel bus. The communication (e.g., transmission) of signals over a high speed serial communication path rather than slower parallel communication paths enable the movement of a large amount of data point-to-point while reducing complexity, cost, power, and space requirements. Thus, a SerDes may achieve high data throughput while lowering power requirements and integrated circuit area.

BRIEF DESCRIPTION OF THE DRAWINGS

Embodiments of the invention are illustrated by way of example and not limitation in the figures of the accompanying drawings in which.

DETAILED DESCRIPTION

The following detailed description refers to the accompanying drawings that show, by way of illustration, and not limitation, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Differential serial I/O circuitry allows for robust signal communication at high data rates. Traditional pre-emphasis methods have a main output path and a separate, parallel pre-emphasis path, increasing both area and power. Traditional transmitter circuits consume 3pj/bit-6pj/bit.

In contrast, a transmitter circuit according to certain embodiments of the present invention can incorporate pre-emphasis with an output stage, which can result in reduced area and lower power while maintaining high speed operation. The improved design can, for example, reduce the termination current and/or simplify internal transmitter circuits, which can reduce the required power in the transmitter circuit. This architecture allows for a single data path and single clocking path. One embodiment of this new transmitter might consume approximately 0.5pj/bit-0.7pj/bit, representing a five to ten fold reduction in power requirements over standard SerDes transmitter implementations.

Figure 1:
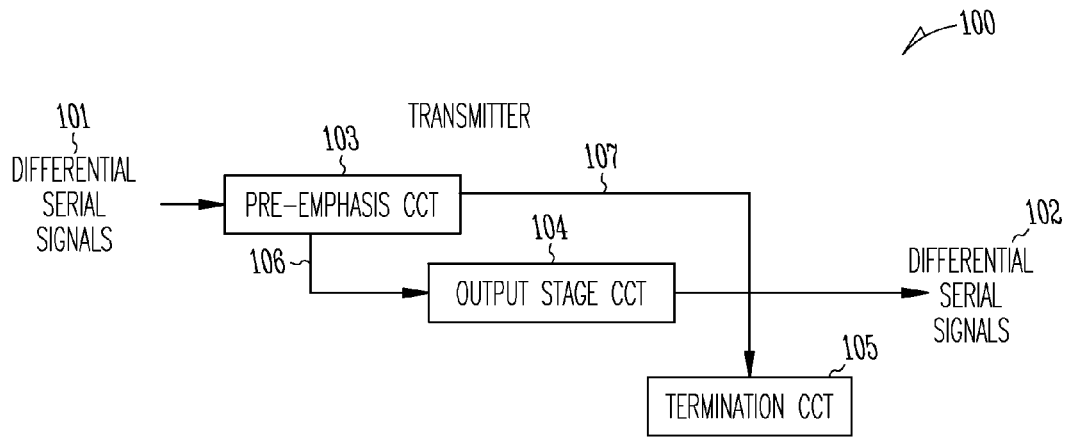
FIG. 1 illustrates a transmitter circuit, according to an embodiment of the invention.

FIG. 1 illustrates a transmitter circuit, according to an embodiment of the invention. The transmitter circuit can be used as a driver. The transmitter circuit 100 receives differential serial signals 101 and drives differential serial signals 102 over communication paths (e.g., lines, pads, etc.). The illustrated transmitter circuit 100 includes a pre-emphasis circuit 103, an output stage circuit 104 and a termination circuit 105. The pre-emphasis circuit 103 can receive differential serial signals (e.g., from a data serializer, such as may be implemented in a SerDes). The pre-emphasis circuit 103 provides (e.g., sends) the differential serial signals to the output stage circuit 104 via path 106, and can also selectively inject charge via path 107 onto communication paths coupled to the output stage circuit 104. The selective charge injection can be used to, for example, compensate for the detrimental effect that a relatively large capacitance of the communication paths has on signal transitions on the communication paths. Thus, charge injected onto the communication paths can, for example, increase the speed of transitions to logic high levels.

Figure 2:
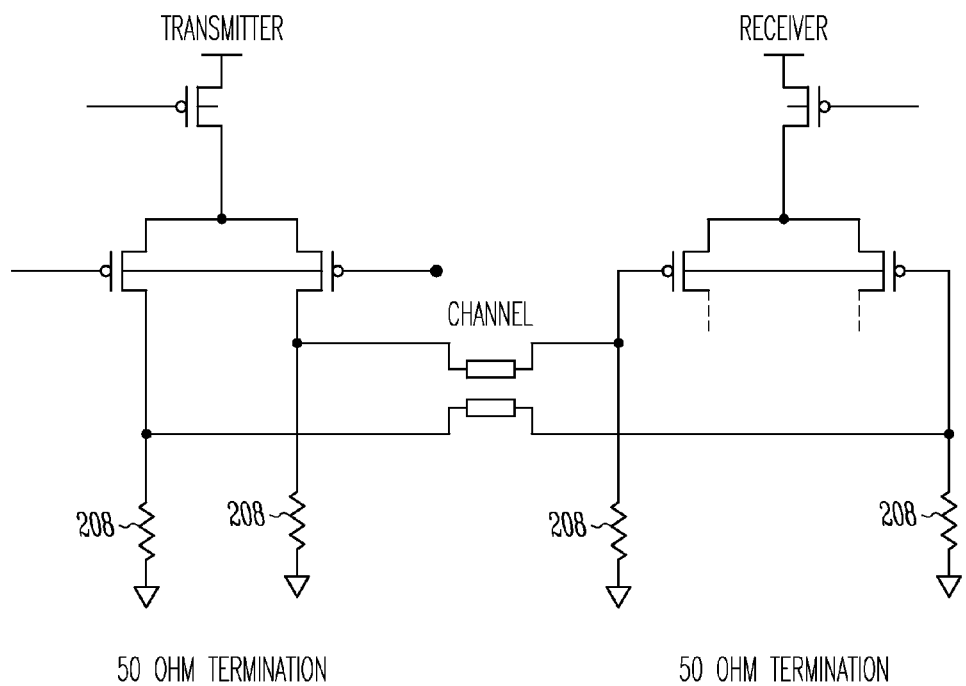
FIG. 2 illustrates a traditional I/O (input/output) circuit.
Figure 3:
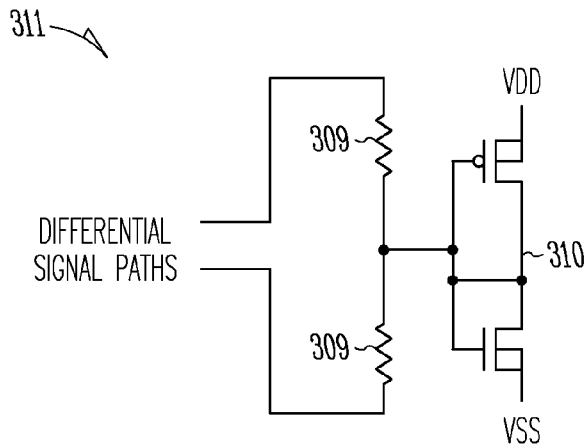
FIG. 3 illustrates a termination circuit according to an embodiment of the present invention.

The termination circuit 105 provides a differential termination, such as to minimize the current required to generate the swing. By way of comparison, a traditional I/O circuit 200 is illustrated in FIG. 2, and a termination circuit according to an embodiment of the present invention is illustrated in FIG. 3. The traditional I/O circuit 200 uses a 50 Ohm to ground termination. As illustrated, for each for the transmitter and the receiver, a 50 Ohm resistance 208 is located between each of the differential communication paths and ground. Since each of the paths includes one of the terminator resistances, the equivalent resistance is two 50 Ohm resistances in parallel. Thus, the termination circuit 200 illustrated in FIG. 2 results in a 25 Ohm system termination impedance.

In contrast, an embodiment of the present invention uses a 100 Ohm differential termination. As illustrated in FIG. 3, 100 Ohm resistances 309 (where the resistances might be provided by discrete resistors and/or parasitic resistances) are coupled to each of the differential communication paths and to a common mode node 310 between a PMOS and NMOS transistor stack 311. The transistor stack 311 determines the common mode voltage between the VDD and VSS potentials. Since each of the paths includes one of the terminator resistances, the equivalent resistance is two 100 Ohm resistances in parallel. Thus, such a termination circuit provides a 50 Ohm system termination impedance, effectively doubling the impedance of the system termination from 25 Ohms to 50 Ohms, which should help reduce the termination current and save communication power requirements.

Figure 4:
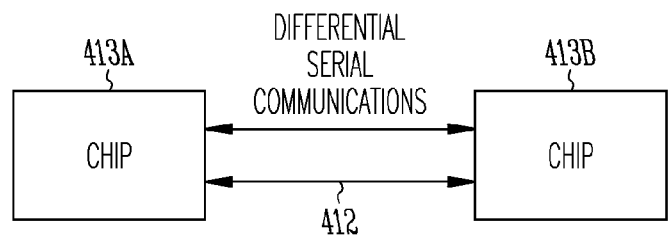
FIG. 4 illustrates differential serial communication between integrated circuit chips, according to an embodiment of the present invention.

FIG. 4 illustrates differential serial communication 412 between chips 413A and 413B, according to an embodiment. By way of example and not limitation, two or more chips may be stacked together. For example, chip 413B may be bonded on top of and electrically coupled (e.g., electrically connected, either directly or indirectly) to chip 413A. This can increase the total integrated circuit area without increasing the footprint of the structure of the stacked chips. However, a design challenge for such structures may be to remove or otherwise control heat emanating from the stack of chips. Embodiments of the present invention can reduce the power consumption for chip-to-chip communication to reduce the heat dissipated from the structure.

Figure 5:
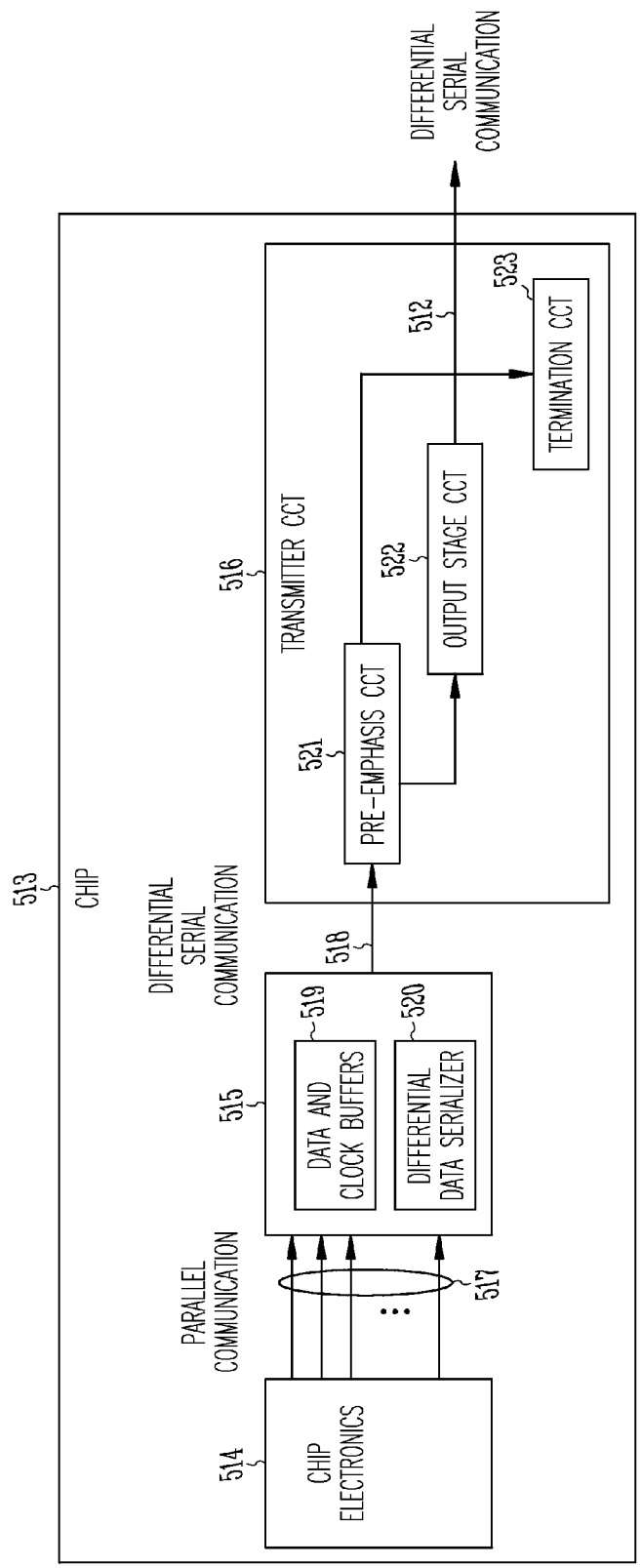
FIG. 5 illustrates an integrated circuit chip, according to an embodiment of the invention.

FIG. 5 illustrates an integrated circuit chip, according to an embodiment of the invention. The illustrated chip 513 includes chip electronics 514, a parallel-to-serial communication conversion circuit 515, such as a serialization function of a SerDes, and a transmitter circuit 516. The chip electronics 514 provide (e.g., output) parallel signals in a wide parallel path 517 to the conversion circuit 515, and the conversion circuit 515 converts the parallel signals to differential serial signals that are provided over differential serial communication paths 518 to the transmitter circuit 516. The transmitter circuit 516 receives, conditions, and drives the differential serial signals over differential communication paths 512 to another chip. The illustrated conversion circuit 515 includes data and clock buffers 519 used to temporarily store the data received over the parallel communication paths 517, and a differential data serializer 520 which is configured to use the data stored in the buffers to form differential serial signals appropriate for communication across the differential serial communication paths 518. The illustrated differential serial transmitter circuit 516, capable of operating as a driver, is similar to the circuit illustrated in FIG. 1, including a pre-emphasis circuit 521, an output stage circuit 522, and a termination circuit 523. The pre-emphasis circuit 521 is integrated within the differential serial transmitter circuit 516. Thus, the pre-emphasis circuit 521 receives differential serial signals via the communication paths 518, after the conversion circuit 515 serializes the communication signals (e.g., data). Thus, in comparison to performing the pre-emphasis on the communication signals on the parallel communication paths 517, such that each of the paths 517 makes use of pre-emphasis circuitry, the embodiment illustrated in FIG. 5 reduces the number of pre-emphasis circuits, simplifies the design, and thus should reduce the power used.

Figure 6:
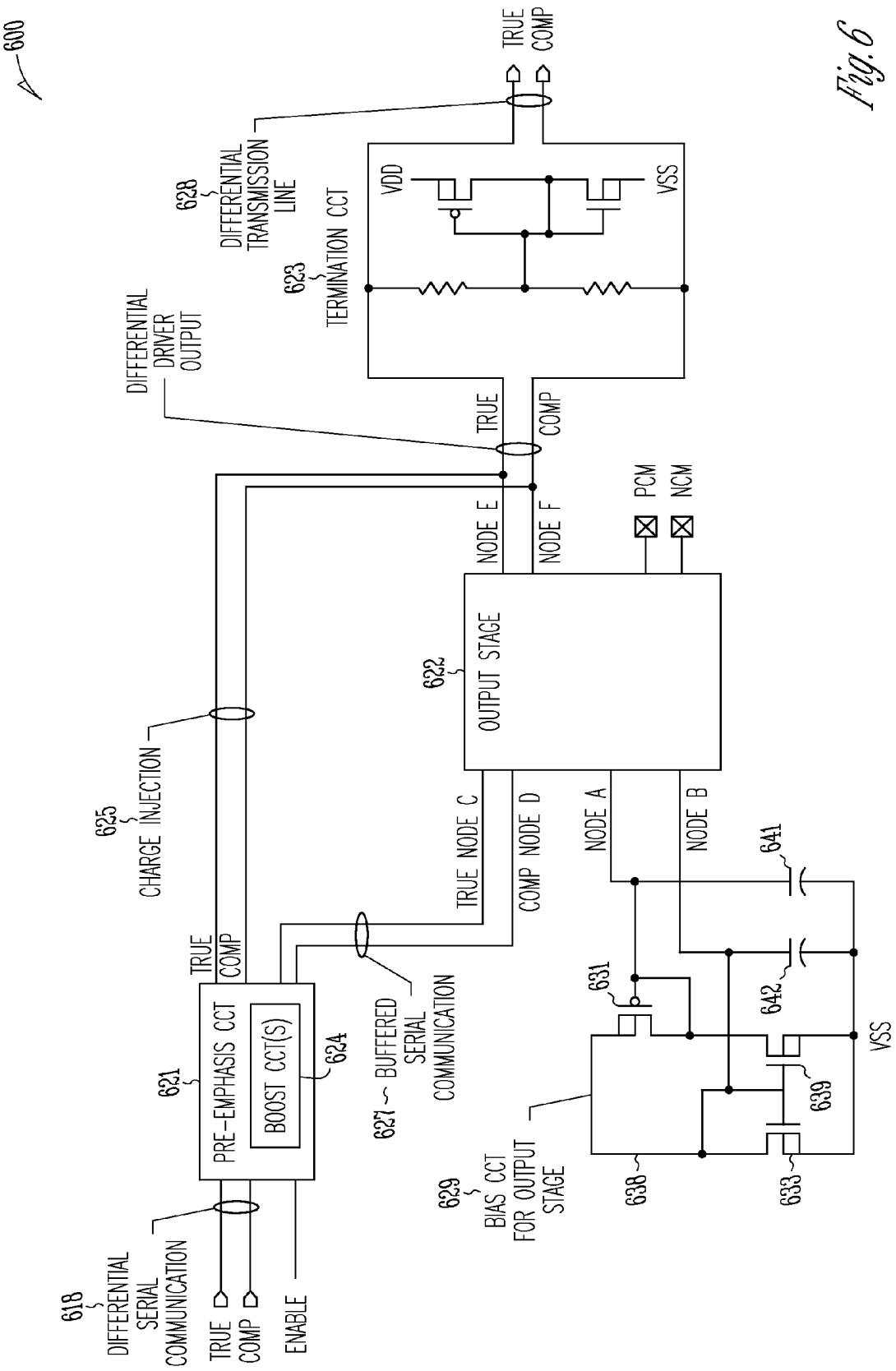
FIG. 6 is a schematic representation of a differential serial transmitter circuit, such as may be illustrated at 100 in FIG. 1 or 516 in FIG. 5 according to an embodiment of the invention.

FIG. 6 is a schematic representation of a differential serial transmitter circuit 600, similar to or identical to the circuit 100 in FIG. 1 or 516 in FIG. 5 according to an embodiment of the invention. The illustrated circuit 600 includes a pre-emphasis circuit 621, an output stage circuit 622, and a termination circuit 623. The termination is a 100 Ohm differential termination as described above with respect to FIG. 3. The output stage 622 is illustrated in more detail in FIG. 7, and the pre-emphasis circuit is illustrated in more detail in FIGS. 8-9.

As shown in FIG. 6, the differential serial signals 618 (e.g., provided by SerDes) are provided over communication paths (e.g., a true signal path (TRUE) and a complementary signal path (COMP)) to the pre-emphasis circuit 621. The pre-emphasis circuit 621 includes one or more boost circuits 624 configured to selectively inject charge onto the communication paths 628 via charge injection paths 625. The pre-emphasis circuit 621 receives an enable signal 626 that controls which of the boost circuit(s) are enabled to selectively inject charge onto the communication paths 628. In some embodiments, the enable signal 626 is a multi-bit signal. For example, a two-bit enable signal can individually enable up to four ($2^2$) sets of boost circuits, and a four-bit enable signal can individually enable up to sixteen ($2^4$) sets of boost circuits. The pre-emphasis circuit 621 buffers the received differential serial signals 618, and provides (e.g., outputs) the buffered serial signals via differential paths 627, including TRUE and COMP signal paths, to the output stage 622, and the output stage 622 drives the buffered differential serial signals, over the TRUE and COMP paths of the differential communication paths 628, which are boosted by the selective charge injection from the pre-emphasis circuit 621. The bias circuit 629 is discussed below, in conjunction with the discussion of FIG. 7.

In the following description of the figures, reference is made to PMOS and NMOS transistors as specific examples of transistors of a first and second doping type. A transistor of a first doping type may be a p-type transistor and an example of a p-type transistor is a PMOS transistor; and a transistor of a second doping type may be an n-type transistor and an example of an n-type transistor is an NMOS transistor. Although MOS is an acronym for metal-oxide-semiconductor, modern transistors often use poly instead of or in addition to metal. Thus, the term MOS is not intended to be limited to metal gates.

Figure 7:
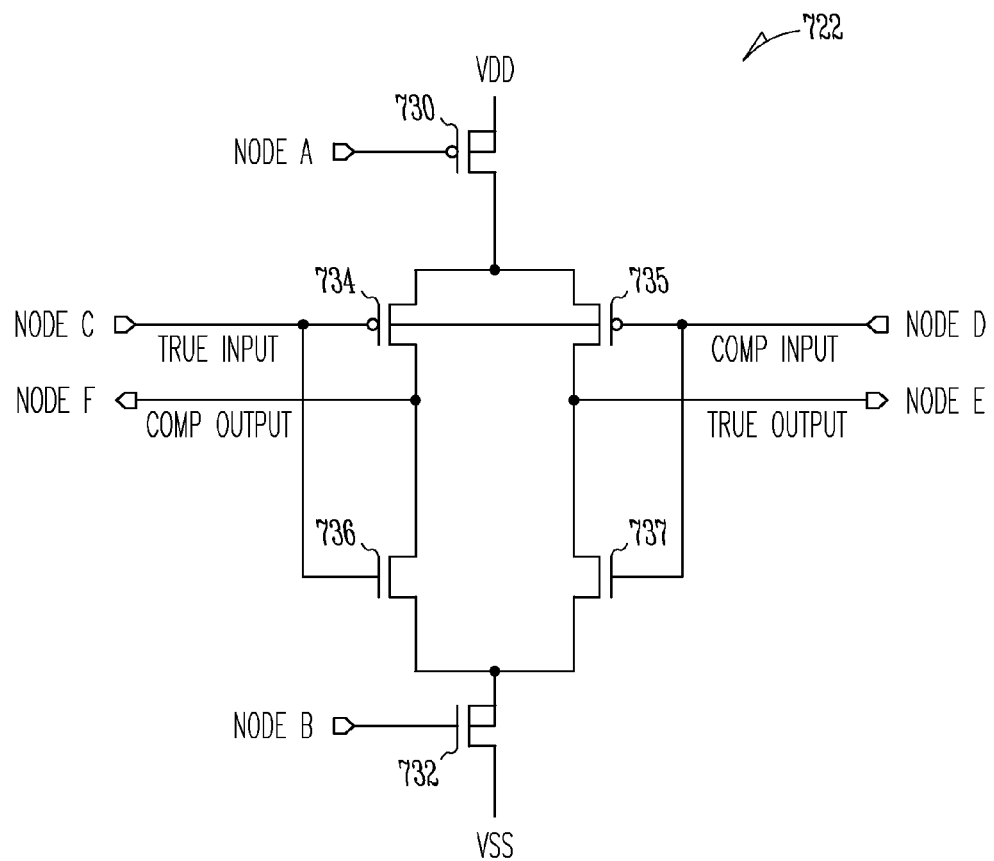
FIG. 7 illustrates an output stage circuit, according to an embodiment of the present invention.

FIG. 7 illustrates an embodiment of the output stage circuit 722. The output stage 722 includes a PMOS transistor 730 that operates in conjunction with a PMOS transistor 631 in the bias circuit 629 of FIG. 6 to provide a PMOS current minor, and an NMOS transistor 732 that operate in conjunction with NMOS transistor 633 in the bias circuit 629 of FIG. 6 to provide an NMOS current minor. The output stage 722 includes differential switching transistors which include PMOS transistors 734 and 735 and NMOS transistors 736 and 737. The gate of PMOS transistor 734 and the gate of NMOS transistor 736 receive the TRUE signal of the buffered differential serial signals 627 from the pre-emphasis circuit 624, and the gate of PMOS transistor 735 and the gate of NMOS transistor 737 receive the COMP signal of the buffered differential serial signals 627 from the pre-emphasis circuit 624. The TRUE signal of the differential driver output signals is driven from Node E between transistors 735 and 737, and the COMP signal for the differential driver output signals is driven from NODE F between transistors 734 and 736. The bias circuit 629 for the output stage includes a programmable current source 638. One example of a programmable current source includes a voltage controlled current source. The programmed current from current source 638 flows, via NMOS and PMOS current minor configurations, through the PMOS and NMOS transistors 730 and 732. NMOS transistor 633 and 639 provide an NMOS current mirror that controls current flow through PMOS transistor 631, which forms a current minor with PMOS transistor 730. NMOS transistors 633 and 639 also form an NMOS current mirror to control the current through NMOS transistor 732. Thus, the programmable current source 638 controls the limits of the current provided to and from the differential communication paths 628, via transistors 730 and 732, for the voltage swings on the differential communication paths 628. The illustrated bias circuit 629 also includes capacitances 641 and 642. These capacitances 641 and 642 (which might be provided by discrete capacitors and/or parasitic capacitances) smooth out and control the voltage applied to the gates of transistors 730 and 732, which maintains the available current flow to and from the differential communication paths 628. Other complementary configurations of NMOS and PMOS mirror circuitry may be used to accomplish current control, as will be apparent to those of ordinary skill in the art, upon reading the content of this disclosure.

Figure 8:
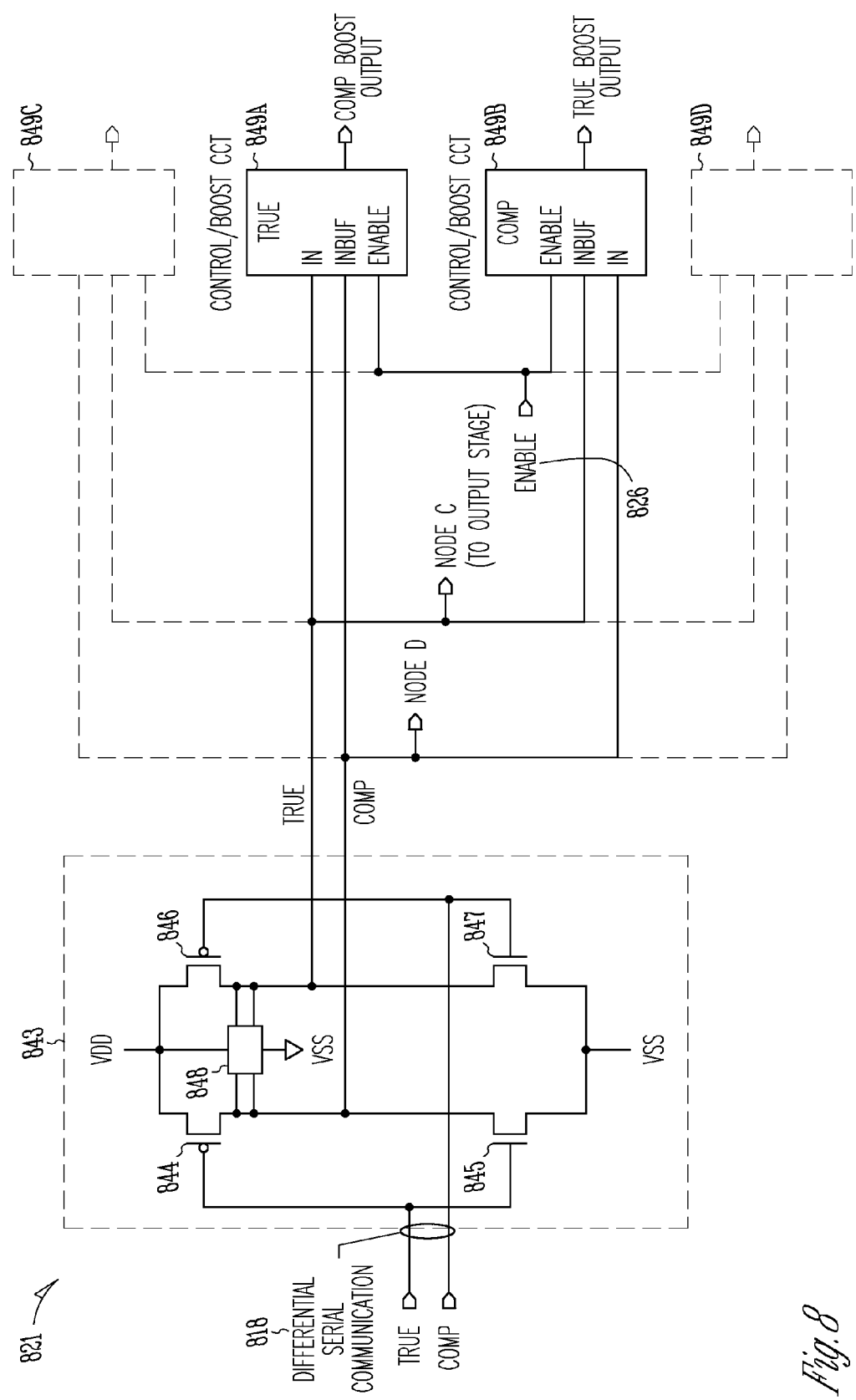
FIG. 8 illustrates a high level view of a pre-emphasis circuit, according to an embodiment of the invention.

FIG. 8 illustrates a high level view of a pre-emphasis circuit 821, according to an embodiment of the invention. Pre-emphasis can be used, for example, to compensate for loss in the channel and provide transmit equalization. The left side of the schematic shows a buffer in the form of a cross-coupled inverter 843 that provides buffered differential signals to the output stage 722 illustrated in FIG. 7. The inverter 843 includes stacked PMOS and NMOS transistors 844, 845, 846 and 847. The gates of transistors 844 and 845 are connected to the TRUE signal path of the differential serial communication paths 818, illustrated as 618 in FIG. 6, and the gates of transistors 846 and 847 are connected to the COMP signal path of the differential serial communication paths 818. A clock inverter feedback 848 can be used to keep the switching point stable for the cross-coupled inverter 843. The clock inverter feedback 848 may be formed using two inverters connected in opposite directions. The inverter 843 provides buffered differential serial signals to the output stage via Node C and Node D.

The illustrated boost circuits 849 operate in sets of two, with one boost circuit 849A in the set operating on the TRUE signal and the other boost circuit 849B in the set operating on the COMP signal. As illustrated, the TRUE signal is received at the true signal input IN of the TRUE boost circuit 849A and is received at the complementary signal input INBUF of the COMP boost circuit 849B, and the COMP signal is received at the complementary signal input INBUF of the TRUE boost circuit 849A and is received at the true signal input of the COMP boost circuit 849B. Additional true and complementary pairs of boost circuits (e.g. 849C, and 849D) may be included. The output of a TRUE boost circuit is a COMP signal, which is connected to the COMP path of charge injection paths 625 in FIG. 6, and the output of a COMP boost circuit is a TRUE signal, which is connected to the TRUE path of charge injection paths 625 in FIG. 6. Each enabled boost circuit can provide selective charge injection to the output of the output stage. The enable signal may be, for example, a single bit signal to enable or disable a single pair of TRUE and COMP boost circuits 849A and 849B, or may be a multi-bit signal capable of addressing more than one pair of TRUE and COMP boost circuits. For example, a two-bit enable signal may address up to four ($2^2$) pairs of TRUE and COMP boost circuits. Additional boost circuits may be added to be enabled together with other boost circuits. Also, enable signals with more than two bits may be used, such as to provide additional unique addresses for uniquely enabling additional boost circuits. These individually-enabled boost circuits can provide variable levels of pre-emphasis for programmable pre-emphasis levels.

Figure 9:
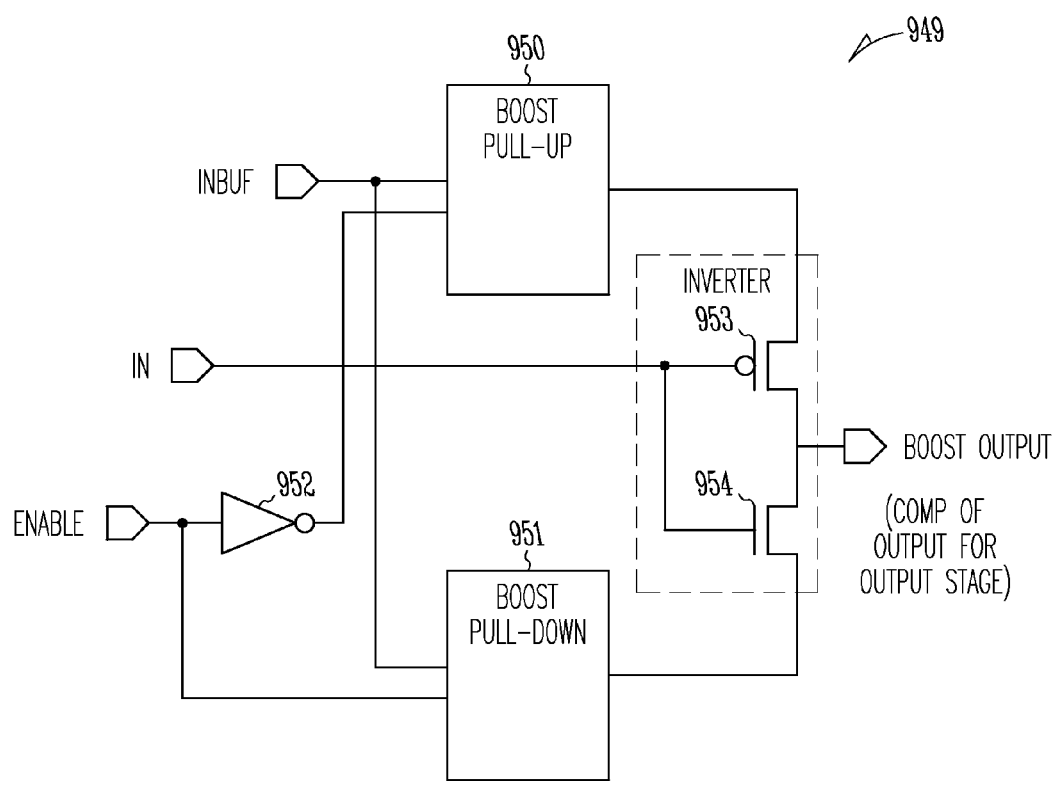
FIG. 9 illustrates a pre-emphasis boost circuit, according to an embodiment of the present invention.

FIG. 9 illustrates a pre-emphasis boost circuit 949, according to an embodiment of the present invention. The illustrated circuit 949 includes a boost pull-up circuit 950 to source current onto the output of the boost circuit, and thus the corresponding output of the output stage. The illustrated circuit 949 also includes a boost pull-down circuit 951 to sink current from the output of the boost circuit. The IN input receives a TRUE signal for the TRUE boost circuits and receives a COMP signal for the COMP boost circuits; and the INBUF input receives a COMP signal for the TRUE boost circuits and receives a TRUE signal for the COMP boost circuits. With inverter 952, and with reference to FIGS. 10 and 11, the signal on the ENABLE input enables the boost pull-down circuit 951 and the boost pull-up circuit 950, or disables the boost pull-up circuit 950 and the boost pull-down circuit 951. The signal on the IN input is provided to the PMOS and NMOS switching transistors 953 and 954, which invert the IN signal to provide an inverted boost output. PMOS switching transistor 953 enables charge from the boost pull-up circuit 950 to be selectively injected (e.g., added, applied, etc.) onto the inverted boost output, and NMOS switching transistor 954 enables charge to be selectively removed from the inverted boost output through the boost pull-down circuit 951. The selective charge injection from the boost pull-up circuit 950 and selective charge removal through the boost-pull-down circuit 951 can provide pre-emphasis. The signal on the INBUF input is complementary to the signal on the IN terminal.

Figure 10:
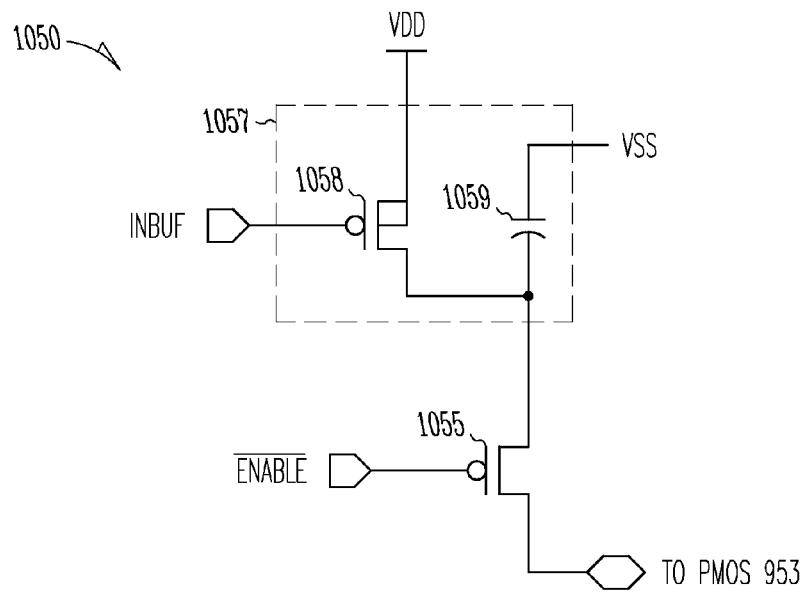
FIGS. 10 and 11 illustrate boost pull up and pull down circuits, according to an embodiment of the invention.
Figure 11:
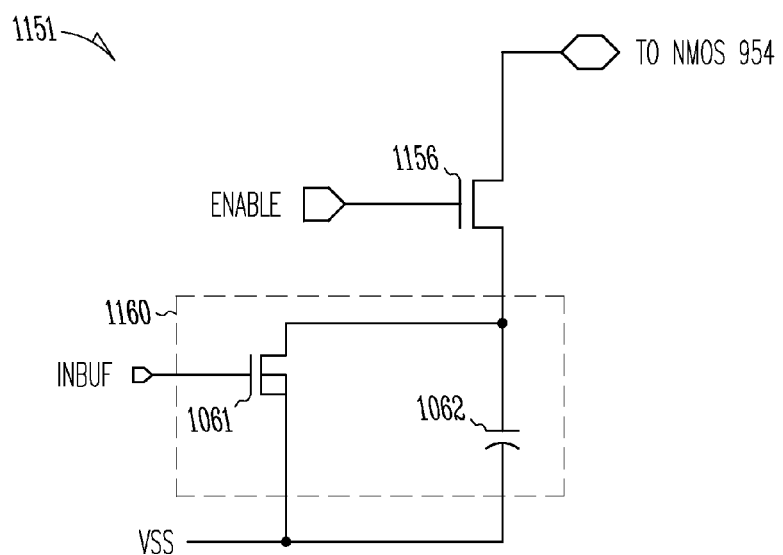

FIGS. 10 and 11 illustrate boost pull up and pull down circuits, according to an embodiment of the invention. PMOS transistor 1055 and NMOS transistor 1156 both respond to the enable signal to enable the boost pull-up and boost pull-down circuits of a pre-emphasis circuit (e.g., of a boost circuit of the pre-emphasis circuit) to provide a programmable output. The INBUF signal is received by a PMOS pre-charge device 1057, which includes a PMOS pull-up transistor 1058 and a boost pull-up capacitance 1059. The PMOS pre-charge device 1057 stores charge on the capacitance 1059 when the signal INBUF is low and injects (e.g., by discharging the capacitance 1059) the charge onto the output node when the signal INBUF transitions from low to high. The INBUF signal is also received by an NMOS pre-charge device 1160, which includes an NMOS pull-down transistor 1061 and a boost pull-down capacitor 1062. The NMOS pre-charge device 1060 stores charge on capacitance 1062 when the signal INBUF is high and removes charge from the output node when the signal INBUF transitions from high to low. By way of example, some embodiments provide capacitances 1059 and 1062 with a capacitance of about 20 fF to provide the charge for a desired pre-emphasis step for an enabled set of boost circuits. The value of the capacitances and the sizing of the transistors 1058 and 1061 are sized together to provide a desired current output to the output nodes to compensate for channel losses.

Figure 12A:
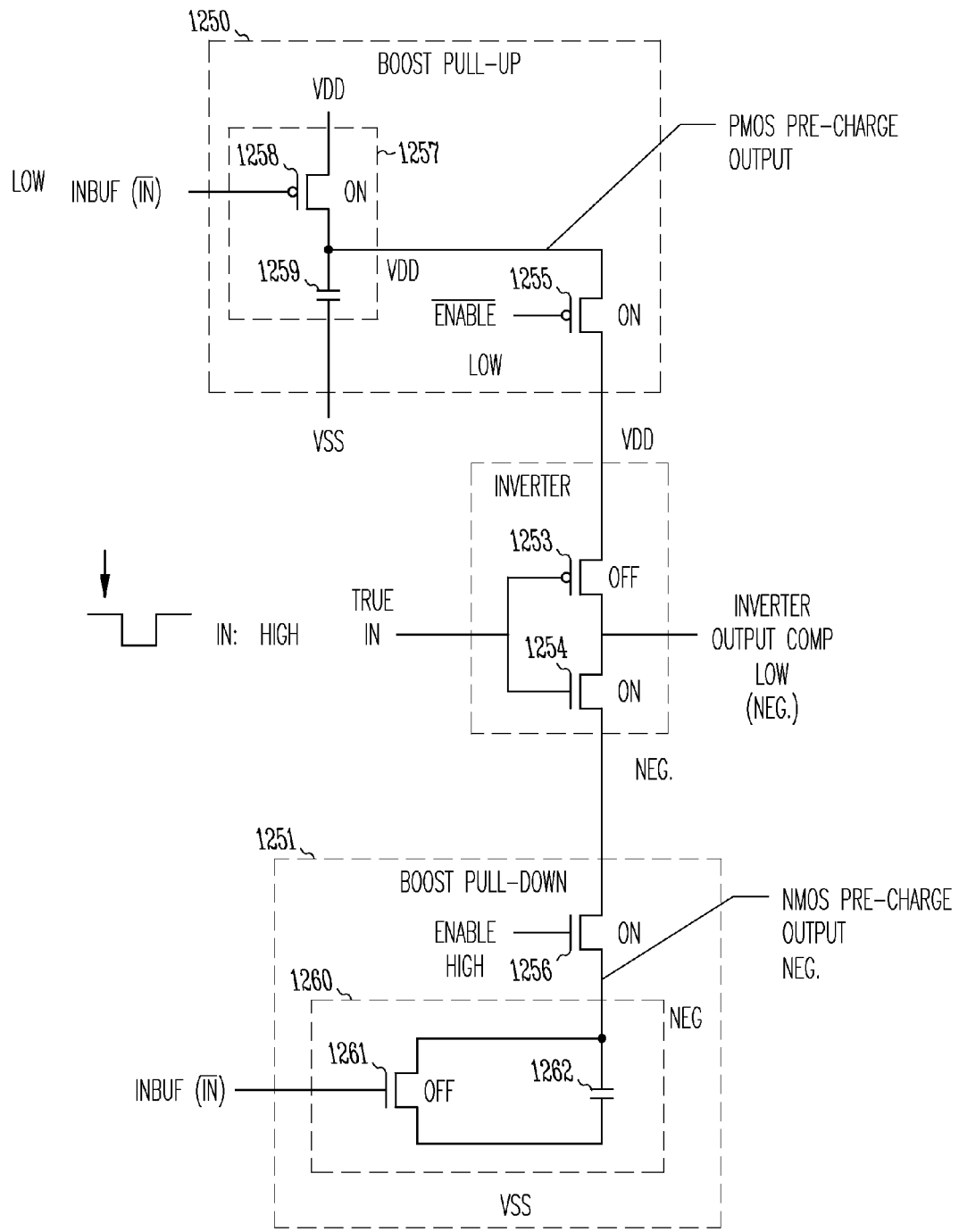
FIGS. 12A-12D illustrate pre-emphasis boost circuit operation for different states of a respective signal.
Figure 12B:
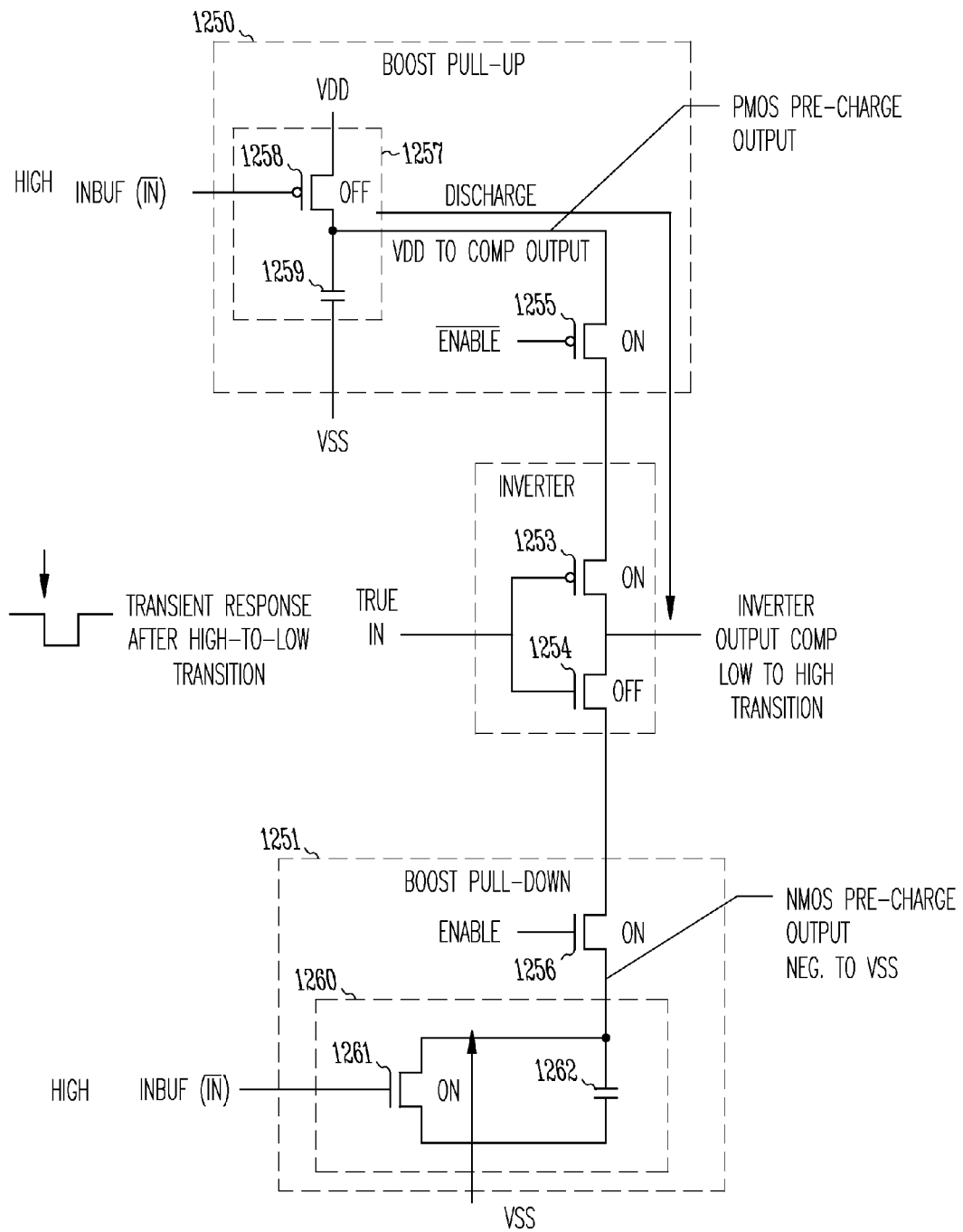
Figure 12C:
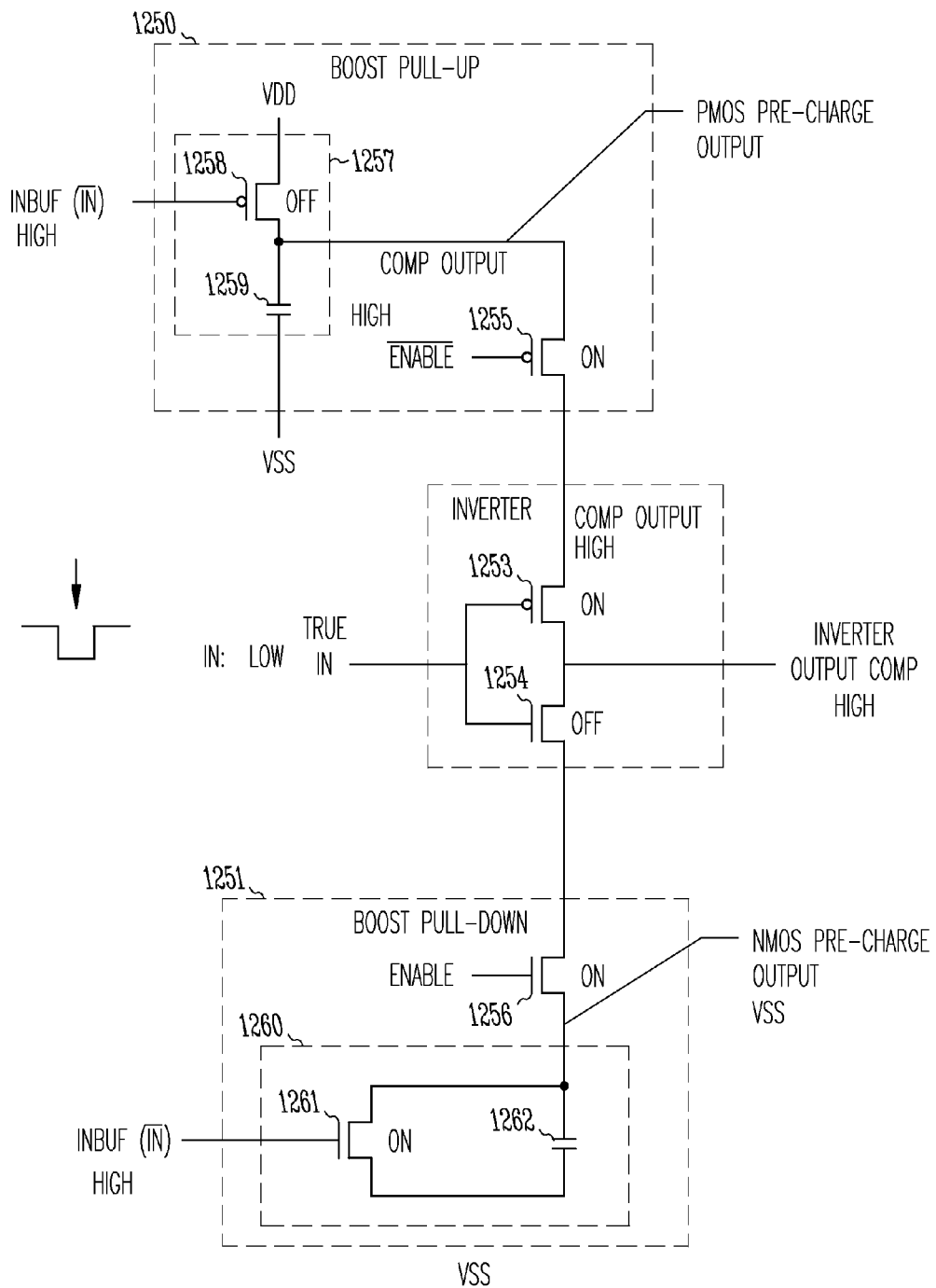
Figure 12D:
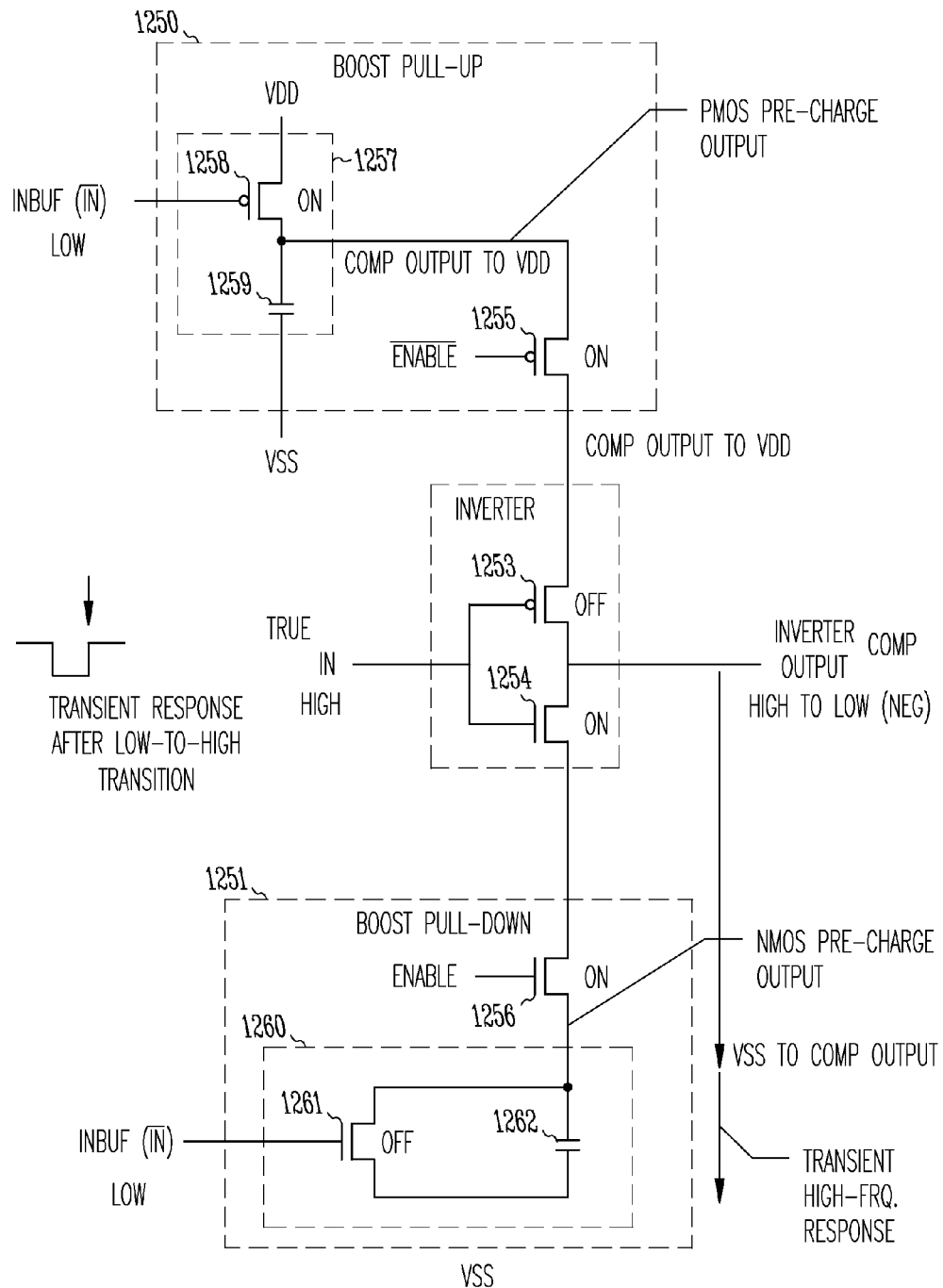

FIGS. 12A-12D illustrate a pre-emphasis boost circuit for different states of the differential serial signals, including a state when the True signal is High (FIG. 12A), a transient state after the True signal transitions from High-to-Low (FIG. 12B), a state when the True signal is Low (FIG. 12C), and a transient state when the True signal transitions from Low-to- High (FIG. 12D). FIG. 12B illustrates a boost pull-up injecting charge onto the inverter output responsive to the True signal transitioning from High-to-Low, and FIG. 12 D illustrates a boost pull-down removing charge from the inverter output responsive to the True signal transitioning from Low-to-High. The ENABLE PMOS transistor 1255 and NMOS transistor 1256 are ON for all of FIGS. 12A-12D.

FIG. 12A illustrates the pre-emphasis boost circuit for a state when the True signal is High. The inverter output, which is Low when IN is High, is connected to the COMP output for the output circuit. INBUF is Low when IN is High. Thus, the PMOS transistor 1253 of the inverter is OFF, the NMOS transistor 1254 of the inverter is ON, the PMOS pull-up transistor 1258 is ON, and the NMOS pull-down transistor 1261 is OFF. The pull-up pre-charge device 1257 stores a charge on the boost pull-up capacitance 1259, as the output of the pull-up pre-charge device has a potential of approximately VDD. Because transistors 1254 and 1256 are ON, the potential at the output of the pull-down pre-charge device 1260 corresponds to the negative COMP signal at the inverter output.

FIG. 12B illustrates a pre-emphasis boost circuit for a transient state after the True signal transitions from High-to-Low. It is recognized that there is a brief period of time where the NMOS and PMOS transistors will both conduct. This figure is intended to illustrate a time after the transistors have switched, but a transient response in the circuit provides the pre-charge function of the device. Thus, the PMOS transistor 1253 of the inverter is ON, the NMOS transistor 1254 of the inverter is OFF, the PMOS pull-up transistor 1258 is OFF, and the NMOS pull-down transistor 1261 is ON.

The pull-up pre-charge device 1257 discharges the charge from the boost pull-up capacitance 1259 onto the inverter output, thus injecting charge onto the inverter output (e.g., to assist with the signal transition as the potential on the inverter output transitions from Low to High). The output of the pull-up pre-charge device 1257 reduces from a potential of approximately VDD down to the potential of the inverter output, and then rises again as the potential of the inverter output rises. As transistor 1261 in the pull-down pre-charge device 1260 is ON but the NMOS transistor 1254 of the inverter is OFF, the output node of the pull-down pre-charge device 1260 rises from a negative potential to VSS.

FIG. 12C illustrates a pre-emphasis boost circuit for a state when the True signal is Low. The inverter output is High when IN is Low. INBUF is High when IN is Low. Thus, the PMOS transistor 1253 of the inverter is ON, the NMOS transistor 1254 of the inverter is OFF, the PMOS pull-up transistor 1258 is OFF, and the NMOS pull-down transistor 1261 is ON. The output of the pull-up pre-charge device 1257 has a potential corresponding to the High potential on the inverter output, because transistors 1253 and 1255 are both ON. The potential at the output of the pull-down pre-charge device 1260 corresponds to VSS, as transistor 1261 is ON.

FIG. 12D illustrates a pre-emphasis boost circuit for a transient state after the True signal transitions from Low-to-High. It is recognized that there is a brief period of time where the NMOS and PMOS transistors will both conduct. This figure is intended to illustrate a time after the transistors have switched, but there is transient current that provides the pre-charge function of the device. Thus, the PMOS transistor 1253 of the inverter is OFF, the NMOS transistor 1254 of the inverter is ON, the PMOS pull-up transistor 1258 is ON, and the NMOS pull-down transistor 1261 is OFF.

The pull-up pre-charge device 1257 is charging capacitance 1259, raising the potential at the pull-up pre-charge device 1257 output to VDD. The step-up voltage applied at the NMOS pre-charge output is a high frequency event, causing a transient high-frequency response through the capacitance 1262 to VSS. As the current flows from the inverter output and charges the capacitance 1262, the potential of the NMOS pre-charge output rises from VSS to the potential of the inverter output, then falls with the potential of the inverter output as it falls to a negative potential.

Figure 13:
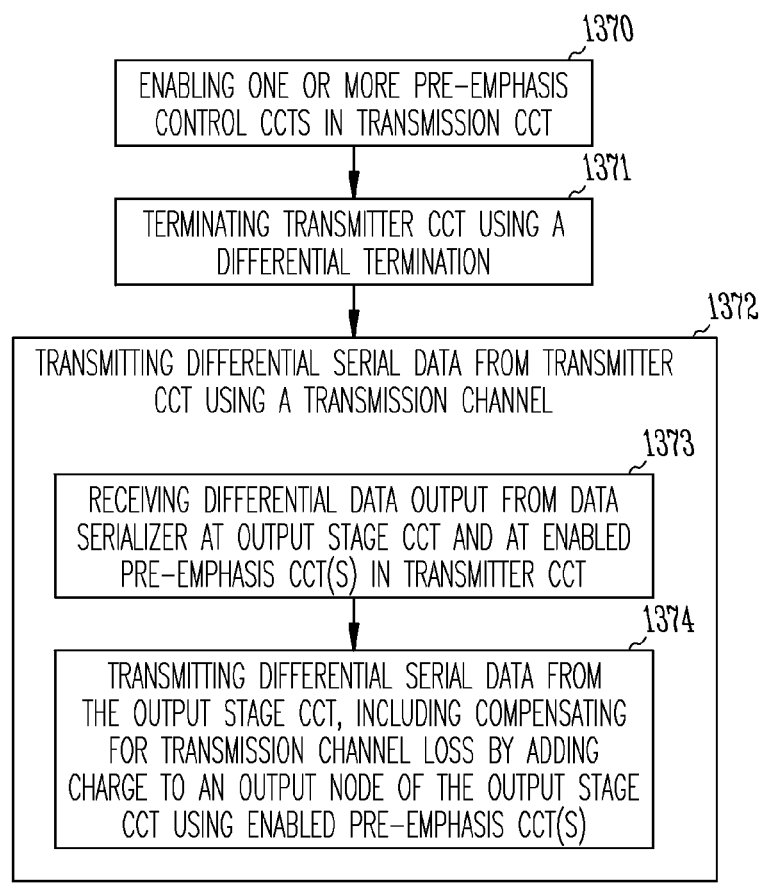
FIG. 13 illustrates a method for pre-charging an output stage of a differential transmitter circuit, according an embodiment of the invention.

FIG. 13 illustrates a method for pre-charging an output stage of a differential transmitter circuit, according an embodiment of the invention. The transmitter circuit includes at least one pre-emphasis circuit, which can include a boost circuit. At 1370, at least one set of the boost circuits is enabled. In a set of boost circuits, a first boost circuit is coupled to a first one of the differential communication paths and a second boost circuit is connected to a second one of the differential communication paths. If each boost circuit includes an inverter, a True input signal to the first boot circuit is output as a Comp signal to the output of the output stage, and a Comp input signal to the second boost circuit is output as a True signal to the output of the output stage. The enable signal may be a multi-bit enable signal used to selectively enable more than one boost circuit. At 1371, the transmitter circuit is terminated using a differential termination circuit, which can reduce the current through the termination resistances and thus, the power usage of the circuit. At 1372, the differential serial signals are communicated (e.g., transmitted) from the transmitter circuit over communication paths. At 1373, the communication of the differential serial signals includes receiving differential serial signals provided from a serializer at both an output stage circuit within the transmitter circuit and at one or more enabled pre-emphasis boost circuits within the transmitter circuit. At 1374, the differential serial signals are transmitted from the output stage circuit, including compensating for communication path loss by using the enabled pre-emphasis boost circuit(s) to selectively inject charge onto an output node of the output stage circuit as the output node transitions to a high potential and using the enabled pre-emphasis boost circuit(s) to selectively remove charge from the output node of the output stage circuit as the output node transitions to a low potential. For example, as the enabled pre-emphasis boost circuit injects charge onto the output for one of the differential communication paths, another enabled pre-emphasis circuit removes charge from the other one of the differential communication paths. A boost pull-up circuit in the pre-emphasis boost circuit selectively injects charge, and a boost pull-down circuit in the pre-emphasis boost circuit selectively removes charge.

Figure 14:
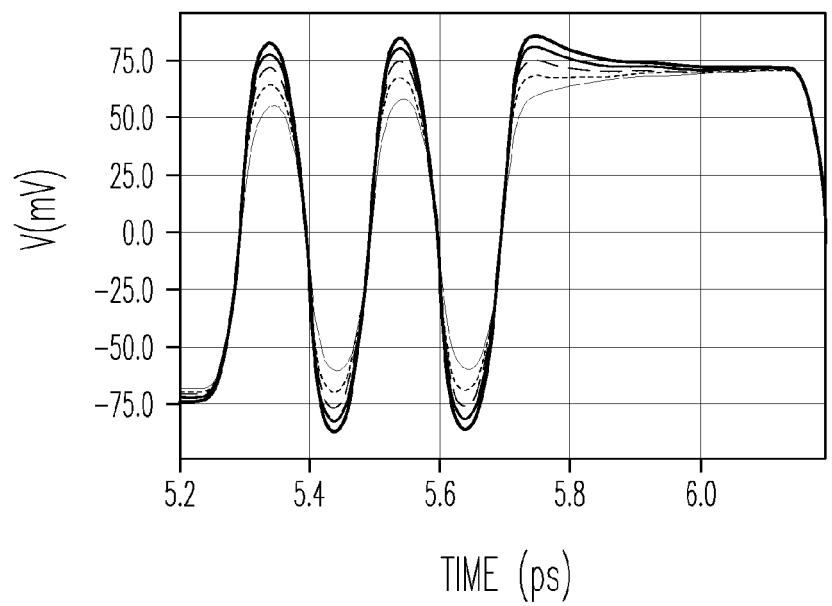
FIG. 14 shows the pre-emphasis programmability on the output node, according to an embodiment of the present invention.
Figure 15A:
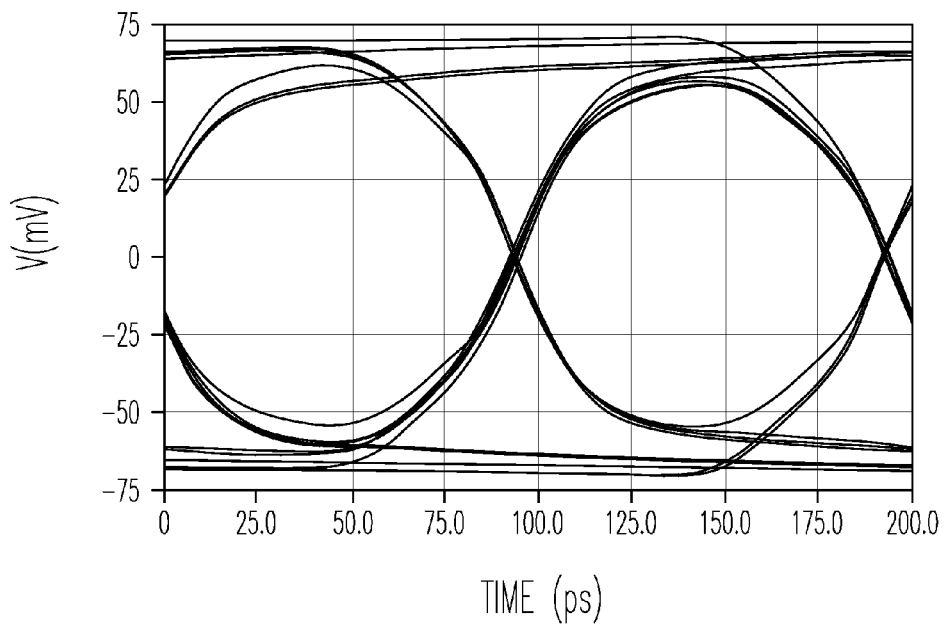
FIGS. 15A-15E show an eye diagram under different pre-emphasis levels for a −5 dB channel loss.
Figure 15B:
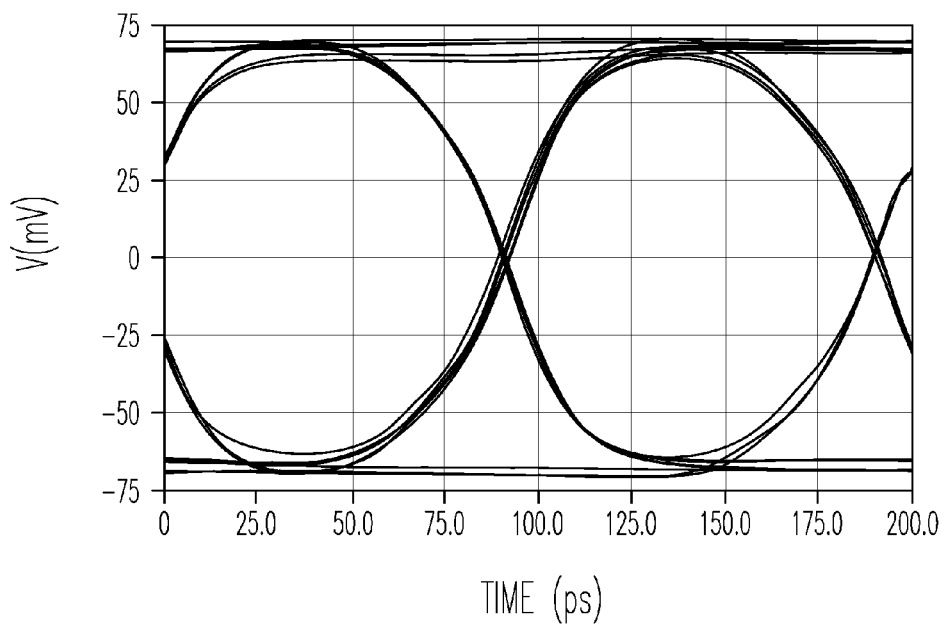
Figure 15C:
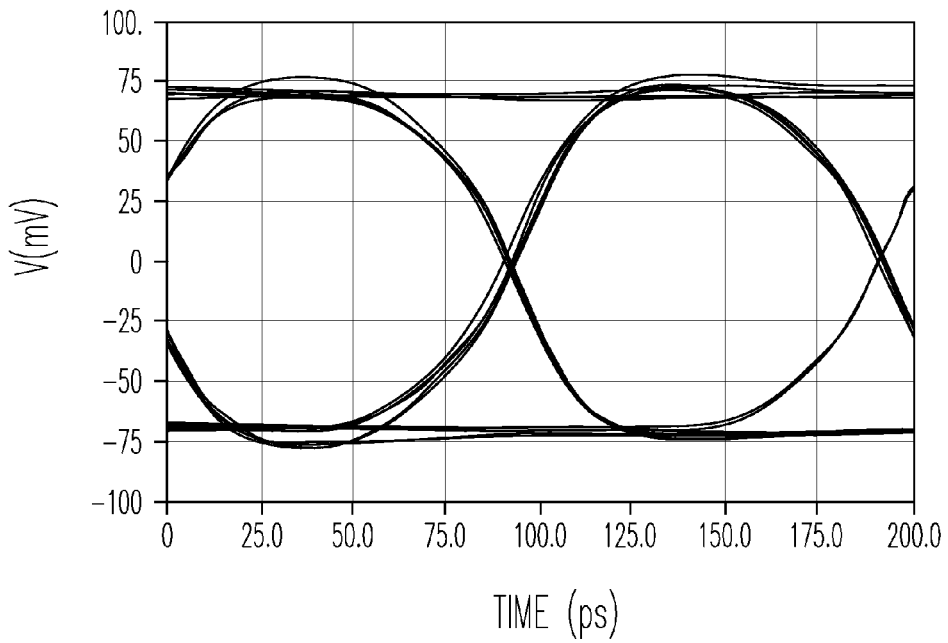
Figure 15D:
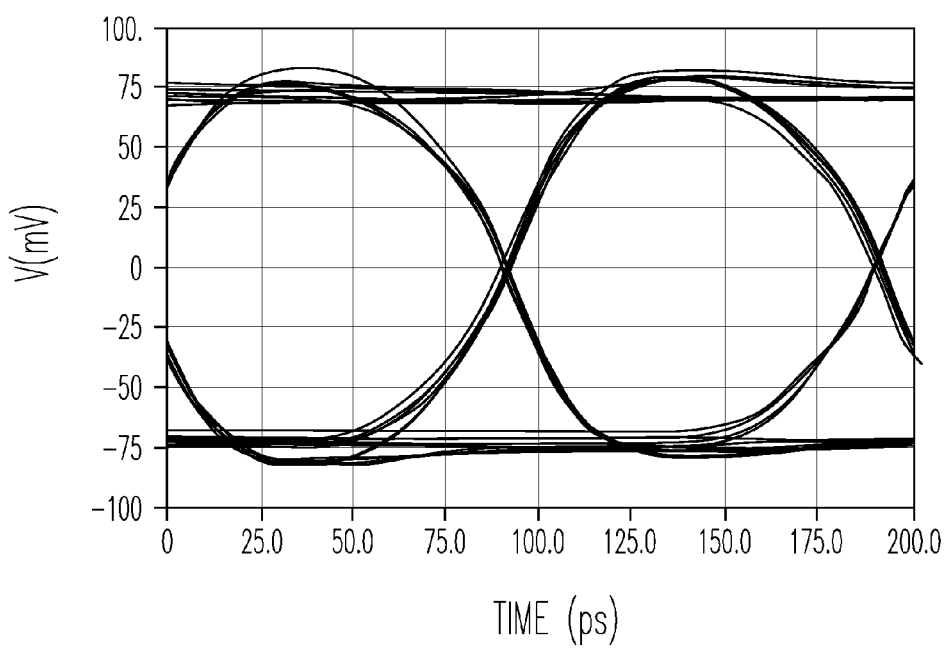
Figure 15E:
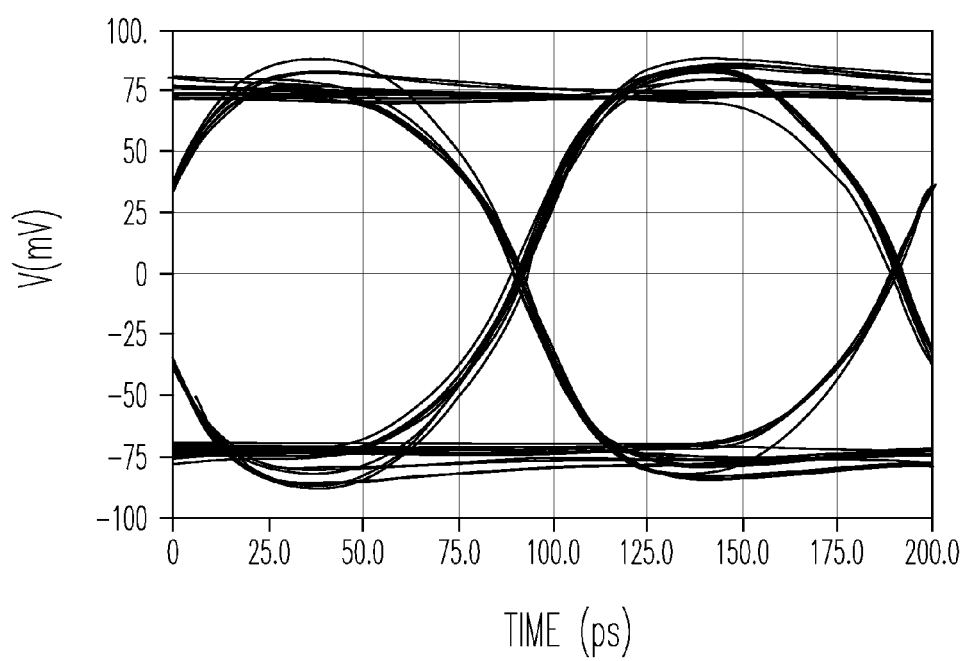
Figure 16A:
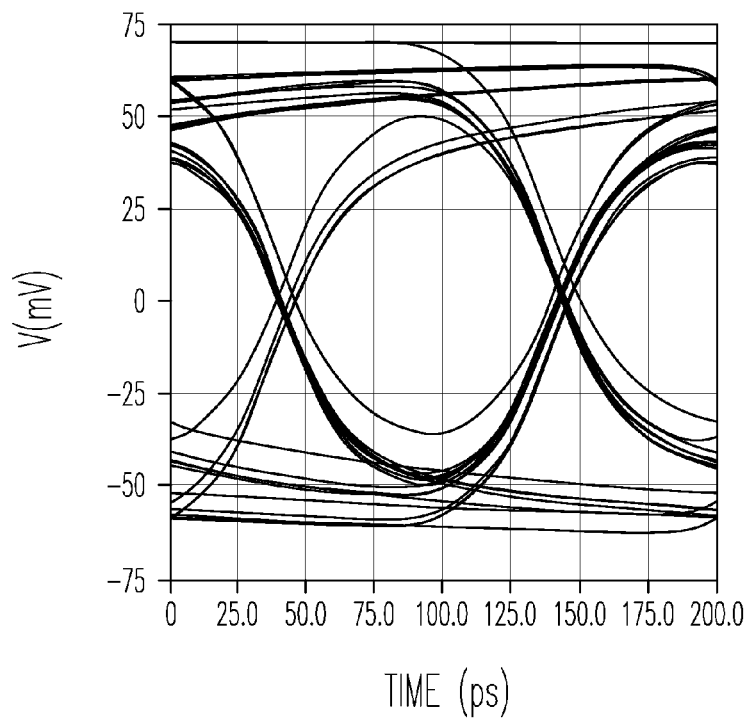
FIGS. 16A-16D show an eye diagram under different pre-emphasis levels for a −10 dB channel loss.
Figure 16B:
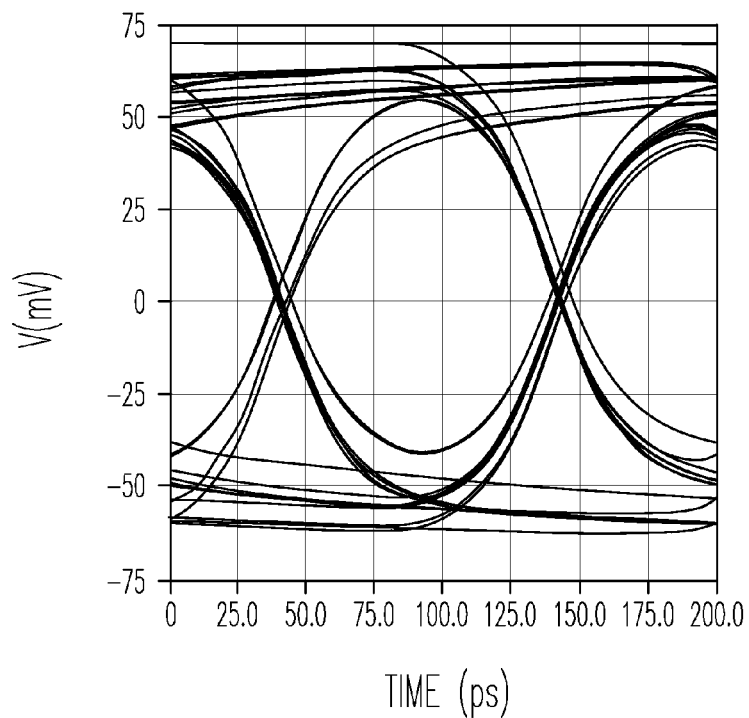
Figure 16C:
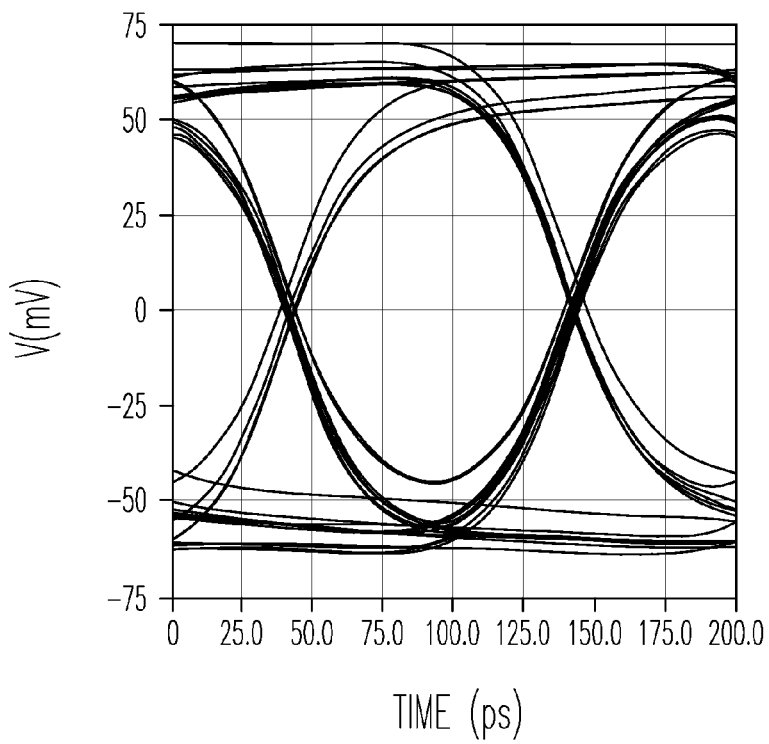
Figure 16D:
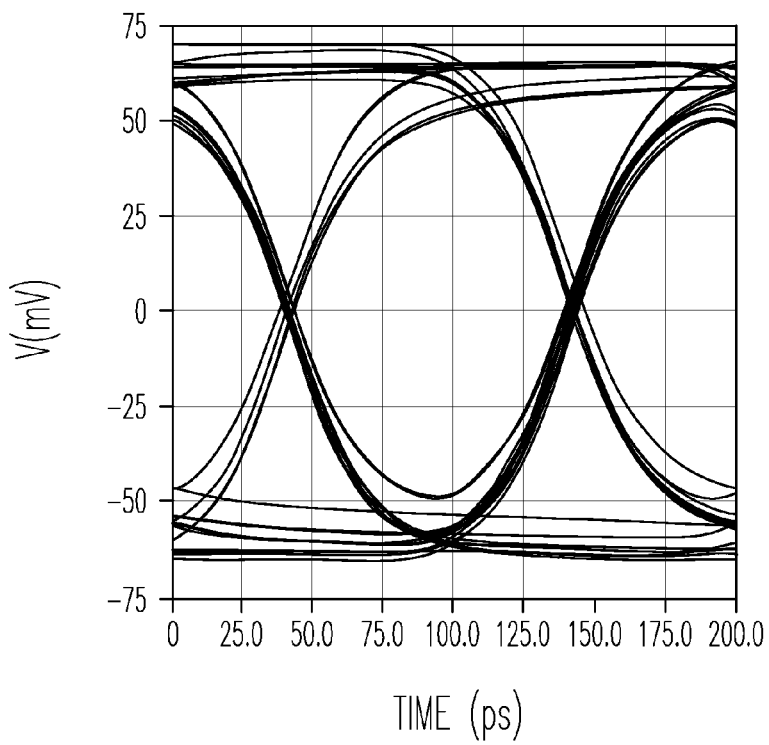

FIG. 14 shows a simulation of the pre-emphasis programmability on the output node. The figure illustrates the signal transitions for no boost circuits and also for one, two, three and four enabled sets of boost circuits. The enabled sets of boost circuitry allow for faster and larger signal transitions. As illustrated with respect to FIGS. 15-16, the programmability of the circuit allows for an appropriate number of boost circuit sets to be enabled for a given characteristic of a communication path. FIG. 15 shows an eye diagram under different pre-emphasis levels for a −5 dB channel loss and FIG. 16 shows an eye diagram under different pre-emphasis levels for a −10 dB channel loss. For a communication path with −5 dB channel loss, the most consistent transitions appear to be provided by two enabled sets of boost circuits. For a communication path with −10 dB channel loss, the most consistent transitions appear to be provided by four enabled sets of boost circuits. These figures are provided as examples, to generally illustrate that additional boost circuits can be enabled to selectively inject more charge onto the communication paths to compensate for greater channel loss on the communication paths. The amount of pre-emphasis can depend on the capacitance used for the pre-charge devices.

Although specific embodiments have been illustrated and described herein, it will be appreciated by those of ordinary skill in the art that any arrangement that is calculated to achieve the same purpose may be substituted for the specific embodiments shown. For example, this document refers to NMOS transistors but the circuitry may be designed to use other N-type transistors, and this document refers to PMOS transistors but the circuitry may be designed to use other P-type transistors. The illustrated circuits may be designed with other n-type and p-type transistors. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus, comprising:
a pre-emphasis circuit configured to receive differential serial signals, and buffer the differential serial signals to provide buffered differential serial signals; and
an output stage circuit configured to receive the buffered differential serial signals and drive the buffered differential serial signals onto differential communication paths,
wherein the pre-emphasis circuit is configured to selectively inject charge onto the communication paths to assist with a signal transition on at least one of the communication paths; and
a termination circuit coupled to the communication paths, wherein the termination circuit is configured to provide a differential termination to a common mode node, the termination circuit including:
a transistor stack connected between a VDD node and a VSS node to determine a common mode potential on the common mode node between a VDD potential on the VDD node and a VSS potential on the VSS node;
a first resistance between and directly connected to both a first one of the differential communication paths and the common mode node; and
a second resistance between and directly connected to both a second one of the differential communication paths and the common mode node.

2. The apparatus of claim 1, wherein the termination circuit includes an approximately 100 Ohm resistance between one of the communication paths and the common mode node, and includes another approximately 100 Ohm resistance between another one of the communication paths and the common mode.

3. An apparatus, comprising:
a pre-emphasis circuit configured to receive differential serial signals, and buffer the differential serial signals to provide buffered differential serial signals; and
an output stage circuit configured to receive the buffered differential serial signals and drive the buffered differential serial signals onto differential communication paths,
wherein the pre-emphasis circuit is configured to selectively inject charge onto the communication paths to assist with a signal transition on at least one of the communication paths, wherein:
the buffered differential serial signals comprise first and second signals; and
the pre-emphasis circuit comprises a boost circuit, wherein the boost circuit comprises:
a boost pull-up circuit and a boost pull-down circuit, wherein each of the boost pull-up circuit and the boost pull-down circuit are configured to receive the first signal; and
a switching transistor of a first doping type coupled between the boost pull-up circuit and a boost output, and a switching transistor of a second doping type coupled between the boost pull-down circuit and the boost output, wherein each of the switching transistors have a gate configured to receive the second signal.

4. The apparatus of claim 3, wherein the boost pull-up circuit and one of the switching transistors are configured to cooperate to inject charge onto the boost output responsive to an output signal on the boost output transitioning to a high potential.

5. The apparatus of claim 3, wherein the boost pull-down circuit and one of the switching transistors are configured to cooperate to remove charge from the boost output responsive to an output signal on the boost output transitioning to a low potential.

6. An apparatus, comprising:
a serializer configured to receive parallel signals and convert the parallel signals into differential serial signals;
a pre-emphasis circuit including:
a buffer configured to receive the differential serial signals and provide buffered differential serial signals; and
a boost circuit configured to receive the buffered differential serial signals and selectively inject charge onto a respective one of a pair of differential communication paths to assist with a signal transition on the respective one of the pair of differential communication paths;
an output stage circuit configured to receive the buffered differential serial signals and drive the buffered differential serial signals onto the differential communication paths; and
a termination circuit, the termination circuit including:
a transistor stack to provide a common mode node, wherein the transistor stack is connected between a VDD node and a VSS node to determine a common mode potential on the common mode node between a VDD potential on the VDD node and a VSS potential on the VSS node;
a first resistance between a first one of the differential communication paths and the common mode node; and
a second resistance between a second one of the differential communication paths and the common mode node.

7. An apparatus, comprising:
a serializer configured to receive parallel signals and convert the parallel signals into differential serial signals;
a pre-emphasis circuit including:
a buffer configured to receive the differential serial signals and provide buffered differential serial signals; and
a boost circuit configured to receive the buffered differential serial signals and selectively inject charge onto a respective one of a pair of differential communication paths to assist with a signal transition on the respective one of the pair of differential communication paths; and an output stage circuit configured to receive the buffered differential serial signals and drive the buffered differential serial signals onto the differential communication paths, wherein:
the buffer configured to provide buffered differential signals comprises a cross-coupled inverter configured to provide first and second signals; and
the boost circuit comprises:
  a first switching transistor of a first doping type coupled to a boost output, and a second switching transistor of a second doping type coupled to the boost output;
  a boost pull-up circuit coupled to the first switching transistor, wherein the boost pull-up circuit and the first switching transistor are configured to cooperate to inject charge onto the boost output responsive to an output signal on the boost output transitioning to a high potential; and
  a boost pull-down circuit coupled to the second switching transistor, wherein the boost pull-down circuit and the second switching transistor are configured to cooperate to remove charge from the boost output responsive to the output signal on the boost output transitioning to a low potential,
  wherein each of the boost pull-up circuit and the boost pull-down circuit are configured to receive the first signal, and wherein each of the switching transistors have a respective gate configured to receive the second signal.

8. The apparatus of claim 7, wherein the boost pull-up circuit includes a pre-charge device, the pre-charge device including a pull-up transistor coupled to a pull-up capacitance, the pull-up transistor having a gate configured to receive the first signal, wherein the pull-up capacitance, the pull-up transistor and the first switching transistor are configured to cooperate to store charge on the pull-up capacitance responsive to the first signal and the output signal being at a low potential, and to discharge charge from the pull-up capacitance to the boost output responsive to the first signal and the output signal transitioning to a high potential.

9. The apparatus of claim 7, wherein the boost pull-down circuit includes a pre-charge device, the pre-charge device including a pull-down transistor coupled to a pull-down capacitance, the pull-down transistor having a gate configured to receive the first signal, wherein the pull-down capacitance, the pull-down transistor and the second switching transistor are configured to cooperate to store charge on the pull-down capacitance responsive to the first signal and the output signal being at a high potential, and to discharge charge from the boost output responsive to the first signal and the output signal transitioning to a low potential.

10. An apparatus, comprising:
a pre-emphasis circuit, including:
  a buffer configured to receive differential serial signals and provide buffered differential serial signals at first and second outputs;
  a set of boost circuits configured to receive the buffered differential serial signals and selectively inject charge onto differential communication paths to assist with signal transitions on the differential communication paths,
  wherein each set includes a first boost circuit and a second boost circuit,
  wherein each boost circuit includes a first input, a second input, an enable input and a boost output,
  wherein, for the first boost circuit, the first input is coupled to the first output of the buffer, the second input is coupled to the second output of the buffer, and the boost output is coupled to a second one of the differential communication paths, and
  wherein, for the second boost circuit, the first input is coupled to the second output of the buffer, the second input is coupled to the first output of the buffer, and the boost output is coupled to a first one of the differential communication paths; and
an output stage circuit configured to receive the buffered differential serial signals and drive the buffered differential serial signals onto the differential communication paths.

11. The apparatus of claim 10, wherein each boost circuit further includes:
a boost pull-up circuit coupled to the second input;
a boost pull-down circuit coupled to the second input; and
a p-type transistor coupled between the boost pull-up circuit and the boost output, and a n-type transistor coupled between the boost pull-down circuit and the boost output, wherein each of the transistors have a respective gate coupled to the first input.

12. The apparatus of claim 11, wherein:
the boost pull-up circuit includes a pull-up pre-charge device coupled to the second input and a p-type enable transistor; and
the boost pull-down circuit includes a pull-down pre-charge device coupled to the second input and a n-type enable transistor, wherein each boost circuit includes a respective inverter coupled to the enable input and coupled between the boost pull-up and boost pull-down circuits.

13. The apparatus of claim 12, wherein:
the pull-up pre-charge device includes:
  a p-type pull-up transistor with a gate coupled to the second input; and
  a boost pull-up capacitance configured to be coupled between the p-type pull-up transistor and a supply voltage; and
the pull-down pre-charge device includes:
  an n-type pull-down transistor with a gate coupled to the second input; and
  a boost pull-down capacitance configured to be coupled between the n-type pull-down transistor and the supply voltage.

14. An apparatus, comprising:
a pre-emphasis circuit configured to receive differential serial signals, and buffer the differential serial signals to provide buffered differential serial signals, the pre-emphasis circuit configured to receive the buffered differential serial signals and selectively inject charge onto differential communication paths to assist with signal transitions on the differential communication paths;
an output stage circuit configured to receive the buffered differential serial signals and drive the buffered differentials signal onto the differential communication paths; and
a termination circuit, the termination circuit including:
  a transistor stack comprising a transistor of a first doping type and transistor of a second doping type to provide a common mode node, wherein the transistor stack is connected between a VDD node and a VSS node to determine a common mode potential on the common mode node between a VDD potential on the VDD node and a VSS potential on the VSS node;
  a first resistance between and directly connected to both a first one of the differential communication paths and the common mode node; and a second resistance between and directly connected to both a second one of the differential communication paths and the common mode node.

15. An apparatus, comprising:
a pre-emphasis circuit configured to receive differential serial signals, and buffer the differential serial signals to provide buffered differential serial signals, the pre-emphasis circuit configured to receive the buffered differential serial signals and selectively inject charge onto differential communication paths to assist with signal transitions on the differential communication paths;
an output stage circuit configured to receive the buffered differential serial signals and drive the buffered differentials signal onto the differential communication paths; and
a termination circuit, the termination circuit including:
 a transistor stack comprising a transistor of a first doping type and transistor of a second doping type to provide a common mode node;
 a first resistance between a first one of the differential communication paths and the common mode node; and
a second resistance between a second one of the differential communication paths and the common mode node, wherein:
 the buffered differential serial signals comprise first and second signals; and
 the pre-emphasis circuit comprises boost circuits, and each boost circuit includes:
  a boost pull-up circuit and a boost pull-down circuit, wherein each of the boost pull-up circuit and the boost pull-down circuit are configured to receive the first signal; and
  a first switching transistor coupled between the boost pull-up circuit and a boost output, and a second switching transistor coupled between the boost pull-down circuit and the boost output, wherein each of the switching transistors have a respective gate configured to receive the second signal.

16. The apparatus of claim 15, wherein the boost pull-up circuit includes a pull-up pre-charge device, the pull-up pre-charge device including a pull-up transistor coupled to a pull-up capacitance, the pull-up transistor having a gate configured to receive the first signal.

17. The apparatus of claim 15, wherein the boost pull-down circuit includes an pull-down pre-charge device, the pull-down pre-charge device including an pull-down transistor coupled to a pull-down capacitance, the pull-down transistor having a gate configured to receive the first signal.

18. An apparatus, comprising:
chip electronics configured to provide parallel communication signals;
a serializer configured to convert the parallel communication signals from the chip electronics into differential serial signals; and
a transmitter circuit, wherein the transmitter circuit includes:
 a pre-emphasis circuit configured to receive the differential serial signals from the serializer and provide buffered differential serial signals, the pre-emphasis circuit configured to selectively inject charge onto differential communication paths to assist with signal transitions on the differential communication paths;
 an output stage circuit configured to receive the buffered differential serial signals and drive the buffered differential serial signals onto the differential communication paths; and
 a termination circuit coupled to the differential communication paths, wherein the termination circuit is configured to provide a differential termination to a common mode node, wherein the termination circuit includes:
  a transistor stack comprising first and second transistors to provide the common mode node, wherein the transistor stack is connected between a VDD node and a VSS node to determine a common mode potential on the common mode node between a VDD potential on the VDD node and a VSS potential on the VSS node;
  a first resistance between a first one of the differential communication paths and the common mode node; and
  a second resistance between a second one of the differential communication paths and the common mode node.

19. The apparatus of claim 18, wherein the pre-emphasis circuit comprises boost circuits, and wherein each of the boost circuits includes an enable input.

20. The apparatus of claim 19, wherein the boost circuits are configured to be enabled in sets of boost circuits that each include a first boost circuit and a second boost circuit.

21. An apparatus, comprising:
a first integrated circuit chip and a second integrated circuit chip stacked with the first integrated circuit chip, wherein the first and second integrated circuit chips are configured to communicate with each other over differential communication paths, each of the first and second integrated circuit chips comprising:
 a serializer configured to convert parallel communication signals into differential serial signals; and
 a transmitter circuit, wherein the transmitter circuit includes:
  a pre-emphasis circuit configured to receive differential serial signals, and buffer the differential serial signals to provide buffered differential serial signals, the pre-emphasis circuit configured to receive the buffered differential serial signals and selectively inject charge onto the differential communication paths to assist with signal transitions on the differential communication paths;
  an output stage circuit configured to receive the buffered differential serial signals and drive the buffered differential serial signals onto the differential communication paths; and
  a termination circuit, the termination circuit including a transistor stack to provide a common mode node, a first resistance between a first one of the differential communication paths and the common mode node, and a second resistance between a second one of the differential communication paths and the common mode node,
wherein:
 the buffered differential serial signals comprise first and second signals; and
 the pre-emphasis circuit comprises boost circuits, wherein each boost circuit includes:
  a boost pull-up circuit and a boost pull-down circuit, wherein each of the boost pull-up circuit and the boost pull-down circuit are configured to receive the first signal; and
  a first switching transistor coupled between the boost pull-up circuit and a boost output, and a second switching transistor coupled between the boost pull-down circuit and the boost output, wherein each of the switching transistors have a respective gate configured to receive the second signal.

22. A method of communicating differential serial signals, comprising:

buffering the differential serial signals to provide buffered differential serial signals;

using the buffered differential serial signals to selectively charge up a pre-charge device;

driving the buffered differential serial signals from outputs of the output stage onto communication paths;

discharging the pre-charge device to one of the communication paths responsive to a potential on the path transitioning from a low to a high potential; and terminating the communication paths using a differential termination circuit coupled to the communication paths, wherein the differential termination circuit is configured to provide a differential termination to a common mode node, the differential termination circuit including:

a transistor stack connected between a VDD node and a VSS node to determine a common mode potential on the common mode node between a VDD potential on the VDD node and a VSS potential on the VSS node;

a first resistance between and directly connected to both a first one of the differential communication paths and the common mode node; and a second resistance between and directly connected to both a second one of the differential communication paths and the common mode node.

23. The method of claim 22, discharging comprises using a boost pull-up circuit to selectively inject charge onto the one of the communication paths.

* * * * *